(12) United States Patent
Lee et al.

(10) Patent No.: US 11,223,785 B2
(45) Date of Patent: Jan. 11, 2022

(54) COMPRESSIVE SENSING IMAGE SENSOR FOR ENHANCING FRAME RATE AND OPERATING METHOD THEREOF

(71) Applicant: GWANGJU INSTITUTE OF SCIENCE AND TECHNOLOGY, Gwangju (KR)

(72) Inventors: Byung Geun Lee, Gwangju (KR); Jin Ho Kim, Gwangju (KR); Hyun Keun Lee, Gwangju (KR); Woo Tae Kim, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 0 days.

(21) Appl. No.: 16/757,360

(22) PCT Filed: Sep. 3, 2018

(86) PCT No.: PCT/KR2018/010212
§ 371 (c)(1),
(2) Date: Apr. 20, 2020

(87) PCT Pub. No.: WO2019/078483
PCT Pub. Date: Apr. 25, 2019

(65) Prior Publication Data
US 2020/0344428 A1 Oct. 29, 2020

(30) Foreign Application Priority Data

Oct. 19, 2017 (KR) .................... 10-2017-0135944
Nov. 7, 2017 (KR) .................... 10-2017-0147583

(51) Int. Cl.
*H04N 5/341* (2011.01)
*H04N 5/3745* (2011.01)

(52) U.S. Cl.
CPC .......... *H04N 5/341* (2013.01); *H04N 5/3745* (2013.01)

(58) Field of Classification Search
CPC ...... H04N 5/341; H04N 5/345; H04N 5/3745; H04N 5/378
See application file for complete search history.

(56) References Cited

U.S. PATENT DOCUMENTS

2017/0214864 A1* 7/2017 Izuha ..................... H04N 5/341
2017/0339363 A1* 11/2017 Hiasa .................... H04N 5/2254

FOREIGN PATENT DOCUMENTS

KR    10-2006-0043071 A    5/2006
KR    10-2007-0091575 A    9/2007
(Continued)

OTHER PUBLICATIONS

Oike, et al., "CMOS Image Sensor With Per-Column ΣΔ ADC and Programmable Compressed Sensing", IEEE Journal of Solid-State Circuits, vol. 48, No. 1, Jan. 2013, Oct. 4, 2012. 11 pages.
(Continued)

*Primary Examiner* — Kevin K Pyo
(74) *Attorney, Agent, or Firm* — Loza & Loza, LLP; Heidi Eisenhut

(57) ABSTRACT

A compressive sensing image sensor includes: a pixel array; and a readout circuit configured to receive pixel data on a shot image in an analogue form, and to process the pixel data, wherein the pixel array includes a plurality of blocks each having a plurality of pixels and arranged in an array form, wherein the circuit includes: a compressive sensing multiplexer to which a plurality of pixel data outputted from a corresponding block from among the plurality of blocks are inputted; an LFSR configured to arbitrarily select at least one pixel data from the plurality of pixel data inputted to the compressive sensing multiplexer; and a delta-sigma ADC configured to receive the at least one pixel data selected by
(Continued)

the LFSR, to delta-sigma modulate the received at least one pixel data, and to generate compressive sensing data for restoring an image of the corresponding block from among the shot images.

11 Claims, 11 Drawing Sheets

(56) References Cited

FOREIGN PATENT DOCUMENTS

| KR | 10-2012-0022034 A | 3/2012 |
| KR | 10-1741754 B1 | 5/2017 |

OTHER PUBLICATIONS

Office Action in co-pending KR Application No. 10-2017-0135944, dated Oct. 18, 2018, 2 pages.
PCT/KR2018/010212. International Search Report & Written Opinion (dated Apr. 25, 2019). 11 pages.

* cited by examiner

| ADC Resolution | Clock cycle (Single slope) | Clock cycle ($2^{nd}$-order $\Delta\Sigma$) |
|---|---|---|
| 8 bit | 256 | 23 |
| 10 bit | 1024 | 46 |
| 11 bit | 2048 | 65 |
| 12 bit | 4096 | 92 |

FIG. 6
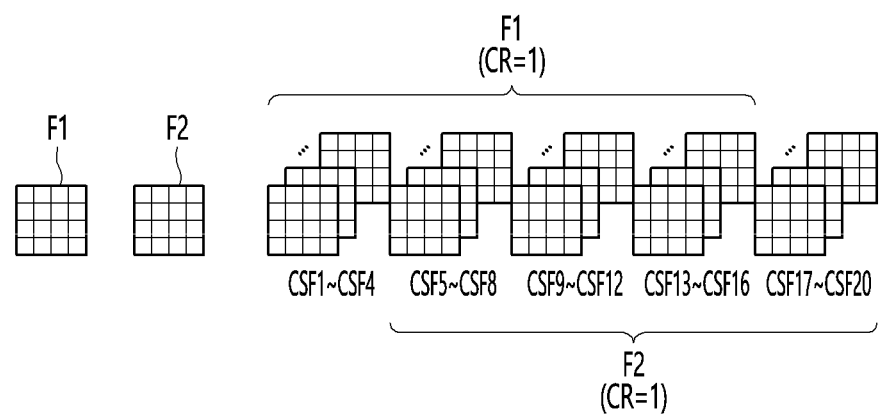
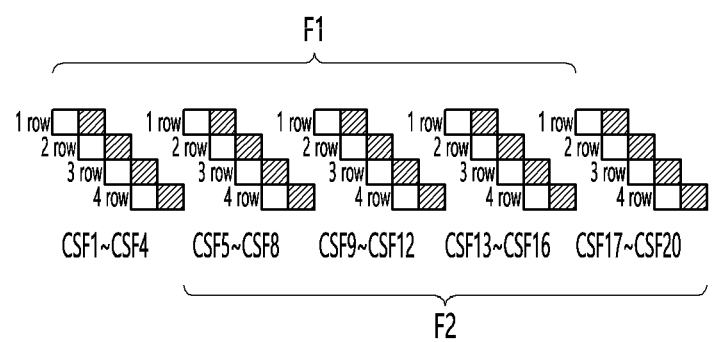

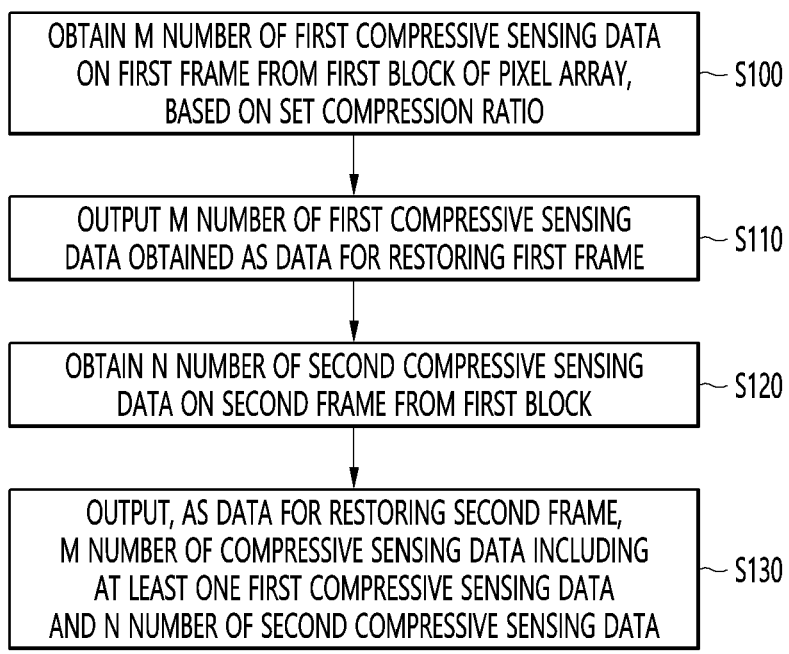
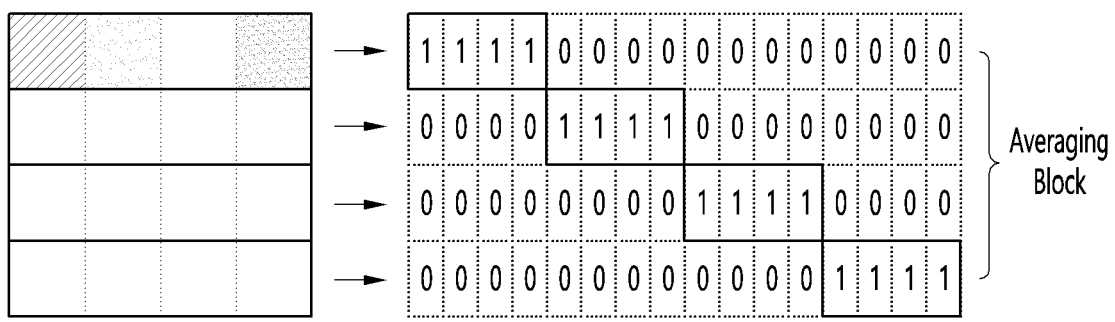

3rd ΣΔ weight function

Equal weight sum

Equal weight sum

CLOCK CYCLE NECESSARY FOR SS ADC AND
DELTA-SIGMA MODULATORS ACCORDING TO RESOLUTION

| Resolution | Single Slope/ 1st order ΔΣ | 2nd order ΔΣ | 3rd order ΔΣ | 4th order ΔΣ |
|---|---|---|---|---|
| 8bit | 256 | 38 | 26 | 28 |
| 10bit | 1024 | 74 | 41 | 38 |
| 12bit | 4096 | 147 | 64 | 53 |
| 14bit | 16384 | 294 | 100 | 75 |
| 16bit | 65536 | 586 | 158 | 105 |

COMPRESSIVE SENSING IMAGE SENSOR FOR ENHANCING FRAME RATE AND OPERATING METHOD THEREOF

TECHNICAL FIELD

The present disclosure relates to an image sensor, and more particularly, to an image sensor which can enhance a frame rate of an image shot by an image sensor having high pixels, by using a block-based compressive sensing method and a delta-sigma analogue-to-digital converter, and an operating method thereof.

In addition, the present disclosure relates to a compressive sensing method using a second or higher-order delta-sigma structure, and more particularly, to a method for enhancing a sensing speed by applying a second or higher-order delta-sigma modulator to compressive sensing.

BACKGROUND ART

In recent years, the demand for high pixels, high resolution, and high speed of a complementary metal-oxide semiconductor (CMOS) image sensor in the market is increasing. The CMOS image sensor is an element that converts an optical signal into an electric signal by using CMOS technology, and is used in various fields such as mobile communication terminals, digital cameras, wearable devices, medical products, etc.

The most representative performance index of the image sensor may be the number of pixels and a frame rate, and in particular, the number of pixels is an index related to a resolution of an image, and the number of pixels should increase in order to enhance a resolution of an image. Accordingly, the image sensor process has been developed to reduce sizes of pixels in order to put more pixels into an image sensor having a limited size.

However, the reduction in the size of the pixel may lead to a reduction in the amount of light absorbed by one pixel, and in turn, may lead to a reduction in an operating voltage area of the pixel. To solve this, an analog-to-digital converter (ADC) having a high resolution is required to exactly distinguish a small voltage range as digital information.

An existing CMOS image sensor mostly uses a single-slope (SS) ADC and a delta-sigma ($\Delta\Sigma$) ADC, which consume little power. The single-slope ADC has the smallest size from among all kinds of ADCs, but has the demerit of requiring much time to convert as a resolution increases. The delta-sigma ADC operates at high speed compared to the single-slope ADC, but has the demerit of having a relatively larger size than the single-slope ADC.

In a normal CMOS image sensor operating method, a rolling shutter method is mostly employed. The rolling shutter method operates in such a way that pixel values positioned in one row are processed by analog-to-digital conversion at a time, and values in the next row are processed in sequence. In order to enhance a frame rate most effectively in the rolling shutter method, ADCs are arranged in all rows of pixels, and all of the ADCs are connected when one row of pixels is processed, and process pixel data, such that the frame rate can be maximized. This method is defined as a column-parallel operating method, and a CMOS image sensor employing this method is disclosed in Korean Patent Registration No. 10-1448918.

Referring to FIG. 1A, if a size of a pixel is larger than or equal to a predetermined size, the single-slope ADC and the delta-sigma ADC may be selectively employed. However, as sizes of pixels are reduced to implement a CMOS image sensor of high pixels, it is impossible to implement an image sensor of a column-parallel operating method by using the delta-sigma ADC of a normal size as shown in FIG. 1B. Therefore, there is no choice but to employ the single-slope ADC in the CMOS image sensor. As the number of pixels of the CMOS image sensor increases, an amount of data to be processed and the time required to process may increase. To this end, there is a limit to the frame rate of the image sensor. In particular, time that is considered to be the most important factor in determining the frame rate of the image sensor may correspond to an operating time of the ADC. As shown in FIG. 2, the operating time of the single-slope ADC is in inverse proportion to a resolution of the ADC. Therefore, when the single-slope ADC of the high resolution is used, the operating time of the ADC may greatly increase in comparison to the delta-sigma ADC, and this may cause a reduction in the frame rate. That is, since the number of pixels of the image sensor increases, but the frame rate is reduced, it may be difficult to ensure enhancement of the overall performance of the image sensor.

As described above, the demand for high pixel, high resolution, and high-speed performance in the CMOS image sensor market is increasing. A representative example may be an HDR camera, an image sensor for vehicles, a monitoring drone image sensor, medical equipment (MRI, CT). However, since the amount of data to be processed by the image sensor and the required time increase according to the demand for high pixel and high resolution, there is a problem that the frame rate is limited. The reason why the demand for high pixel, high resolution of the image sensor, and the demand for high speed conflict each other is as follows. An operating time of an existing image sensor may be determined by a hardware-level characteristic of an ADC. Sizes of pixels of image sensors may be gradually reduced to allow more pixels to be putted into a limited size according to the demand for high pixel performance. Accordingly, an existing CMOS image sensor mostly uses a single-slope ADC and a delta-sigma ADC, which are easy to design in a limited size and consume little power. However, the ADCs described above have a small size, but the time required to convert data abruptly increases as a resolution increases. In addition, in the case of the single-slope ADC, the time required to convert data abruptly increases as the resolution increases, as shown in FIG. 8. This results in a reduction in the frame rate of the image sensor.

To overcome the structural characteristics described above and to reduce speed required to convert data, researches on compressive sensing are actively ongoing. The compressive sensing refers to a principle that, if a signal has a scarce characteristic, the signal can be restored close to the original signal even by sampling fewer signal than in the existing Shannon-Nyquist theory. According to this principle, a huge amount of original data is compressed based on a measurement matrix, and the time required to convert data may be greatly reduced. Accordingly, since a limit to speed caused by the structural characteristic of the image sensor may increase in a signal processing method, hardware for performing compressive sensing in the CMOS image sensor requiring a high frame rate is developing.

U.S. Patent Publication No. 2014/0231620 A1 discloses a CMOS image sensor performing compressive sensing as related-art technology. This patent shows that a sampling method of a delta-sigma modulator is an efficient structure to be applied to a method required by compressive sensing. In the case of a delta-sigma structure, a weighting factor is given to an input. Since the weighting factor is uniform in the case of a first-order delta-sigma, it is easy to derive a linear combination from original data. However, in the case of the first-order delta-sigma, there is a problem that much time is required to convert data of a high resolution as shown in FIG. 17. This problem may be solved through a high-order delta-sigma, but in the case of the high-order delta sigma, there may be a problem that the weighting factor is reduced in a linear pattern or a non-linear pattern according to an order of reading out data. Since all of the data constituting a linear combination should have the same weighting factor in order for a modulator to derive the linear combination, existing compressive sensing image sensors cannot apply a delta-sigma modulator having a second or higher-order coefficient.

As second related-art technology, Korean Patent Application No. 10-2016-0027257 (Mar. 7, 2016) suggests a compressive sensing method using a second-order delta-sigma to solve the problem of the first-order delta-sigma structure disclosed in U.S. Patent Publication No. 2014/0231620 A1. The invention using the second-order delta-sigma includes a forward sampling process and a backward sampling process for a specific pixel by using the feature that the weighting factor of the second-order delta-sigma is linearly reduced. In the forward sampling process for each pixel, the weighting factor is linearly reduced, and, in the backward sampling process for each pixel, the weighting factor linearly increases. Accordingly, all pixels obtain the same weighting factor by passing through both of the two sampling processes. However, the invention of the second related-art technology has a problem that it cannot be used in a third-order delta-sigma modulator structure.

As the demand for HDR technology is increasing in recent years, the demand for high-resolution ADC-applied sensors to implement a wide dynamic range is also increasing. However, in the case of a single-slope ADC or a first-order delta-sigma, the number of necessary cycles exponentially increases as a resolution increases as shown in FIG. 17. There is a great limit to a frame rate. Accordingly, it can be seen that the demand for a high resolution and the demand for a frame rate conflict each other. However, as shown in FIG. 8, when a high-order delta-sigma is applied, the number of cycles required for a high resolution is abruptly reduced, and this means that a frame rate increases. That is, the high-order delta-sigma may be referred to as a structure that can satisfy both of the two demands in the market for high resolution and high-speed image sensors. However, compressive sensing based on a typical binary measurement matrix should derive a linear combination of an original signal, compared to an existing sensing method. The reason why a first-order delta-sigma is used in the related-art technology is that there is no problem in deriving a linear combination since a constant weighting factor is given to an input regardless of an order of the input in the case of the first-order delta-sigma. However, since the high-order delta-sigma has a weight function that is reduced according to an order of an input, a weight given to each data is also reduced when data is inputted in sequence, and thus it is difficult to derive a linear combination. Accordingly, the present disclosure suggests a sampling method which can allow an original signal to have a constant weight sum at an ADC output when a high-order delta-sigma is used, and shows that a fast sensing speed that the high-order delta-sigma has can be used in compressive sensing.

DISCLOSURE OF THE INVENTION

Technical Problem

An object to be achieved by the present disclosure is to provide a method for enhancing a frame rate by applying a delta-sigma ADC to a high-pixel image sensor.

Another object to be achieved by the present disclosure is to provide a method for enhancing a frame rate while maintaining a high compression ratio when making a video with a high-pixel image sensor applying a compressive sensing method.

Still another object to be achieved by the present disclosure is to provide a method for applying a modulator of a second or higher-order delta-sigma structure to a compressive sensing image sensor.

Technical Solution

A compressive sensing image sensor according to an embodiment of the present invention may include: a pixel array including a plurality of pixels; and a readout circuit configured to receive pixel data on a shot image in an analogue form from the plurality of pixels, and to process the pixel data, wherein the pixel array includes a plurality of blocks each having a plurality of pixels and arranged in an array form, wherein the readout circuit includes: a compressive sensing multiplexer to which a plurality of pixel data outputted from a corresponding block from among the plurality of blocks are inputted; a linear feedback shift register (LFSR) configured to arbitrarily select at least one pixel data from the plurality of pixel data inputted to the compressive sensing multiplexer; and a delta-sigma analog-to-digital converter (ADC) configured to receive the at least one pixel data selected by the LFSR, to delta-sigma modulate the received at least one pixel data, and to generate compressive sensing data for restoring an image of the corresponding block from among the shot images.

According to an embodiment, the compressive sensing data may include a plurality of compressive sensing data, and a number of the plurality of compressive sensing data may be changed based on a set compression ratio.

According to an embodiment, the number of the plurality of compressive sensing data may increase as the set compression ratio increases.

According to an embodiment, the number of the plurality of compressive sensing data may be changed based on a number of pixels included in the corresponding block and the compression ratio.

According to an embodiment, when the compressive sensing image sensor makes a video, the readout circuit may be configured to output, as data for restoring a current frame, at least one compressive sensing data obtained from the current frame of the video, and at least one compressive sensing data of an already-obtained previous frame.

According to an embodiment, a plurality of pixel data outputted from a plurality of blocks included in a corresponding block column from among the plurality of blocks may be inputted to the compressive sensing multiplexer.

The LFSR may be configured to arbitrarily select the at least one pixel data from the plurality of pixel data by applying a pseudo-random number generation method.

The delta-sigma ADC may include a delta-sigma modulator and a decimation filter, and wherein the delta-sigma modulator may be a second-order delta-sigma modulator.

According to an embodiment of the present disclosure, an operating method of a compressive sensing image sensor for making a video may include the steps of: obtaining a plurality of pixel data on a first frame of the video from a block having a plurality of pixels; selecting pixel data of one group including at least one pixel data from among the obtained plurality of pixel data; and obtaining first compressive sensing data for restoring the first frame of the block by performing delta-sigma modulation with respect to the selected pixel data group by using an ADC corresponding to the block.

According to an embodiment of the present disclosure, a compressive sensing method of an image sensor may include the steps of: selecting a certain pixel group according to a measurement matrix in the arrangement of the image sensor; deriving a solution of a partition problem to determine an order in which individual pixels in the selected group are inputted to the delta-sigma modulator, and deriving a sampling order by applying the solution of the partition problem; and performing oversampling according to the sampling order derived by using the solution of the partition problem.

Advantageous Effects

According to various embodiments of the present disclosure, the image sensor reduces the number of necessary ADCs by applying the block-based compressive sensing method, and thus a delta-sigma ADC having a fast processing speed can be used in a high-pixel image sensor requiring a high-resolution ADC. Accordingly, by minimizing a delay in the processing speed of the high-resolution ADC, a frame rate of an image shot by the high-pixel image sensor can be enhanced.

According to various embodiments of the present disclosure, the image sensor can provide, as data for restoring a current frame, compressive sensing data on an already obtained previous frame and compressive sensing data on the current frame when making a video. That is, the data for restoring the current frame can be obtained simply by performing the compressive sensing data obtaining process with respect to the current frame only a single time. Therefore, a high compression ratio on the video can be maintained and also a frame rate can be enhanced. Accordingly, in both of the quality aspect of the restored video and the frame rate aspect, performance satisfaction can be enhanced.

In addition, according to an embodiment of the present disclosure, a second or higher-order delta-sigma modulator is used, such that a sensing speed can increase compared to a lower-order modulator.

BRIEF DESCRIPTION OF THE DRAWINGS

FIGS. 5 and 6 are views provided to explain a difference between a related-art rolling shutter video coding method and a block-based compressive sensing method according to an embodiment of the present disclosure;

FIG. 8 is a flowchart provided to explain an operating method of an image sensor applying the block-based compressive sensing method according to an embodiment of the present disclosure;

FIG. 9 is a view illustrating an example of a measurement matrix when a compression ratio is 1/4, in relation to another embodiment of the present disclosure;

BEST MODE

Hereinafter, embodiments of the present disclosure will be described in detail with reference to the accompanying drawings. The terms "module" and "unit" used for elements in the following description are assigned or interchangeably used only in consideration of easy writing of the specification, and do not have a meaning or a role of being distinguished from each other. In the description of exemplary embodiments of the present disclosure, certain detailed explanations of related art are omitted when it is deemed that they may unnecessarily obscure the essence of the embodiments of the present disclosure. In addition, the accompanying drawings are just for easy understanding of the embodiments of the present disclosure, and the technical concept of the present disclosure is not limited by the accompanying drawings. It should be appreciated that various embodiments of the present disclosure include various changes, equivalents, or replacements included in the technical concept and the technical scope of the present disclosure.

Figure 1A:
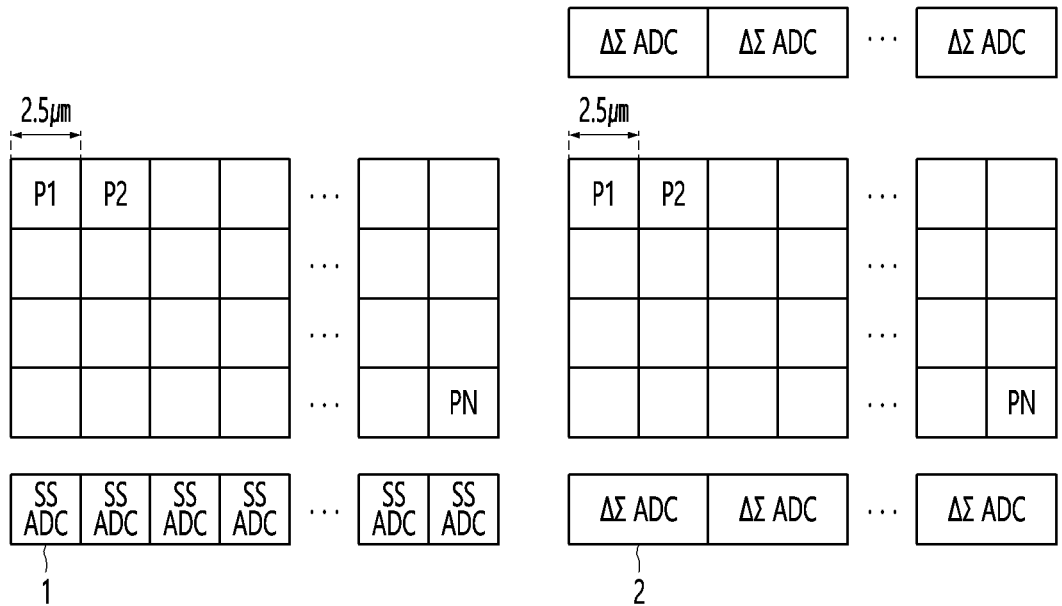
FIGS. 1A and 1B is a schematic block diagram of a pixel array and an ADC for column-parallel processing of a related-art image sensor.
Figure 1B:
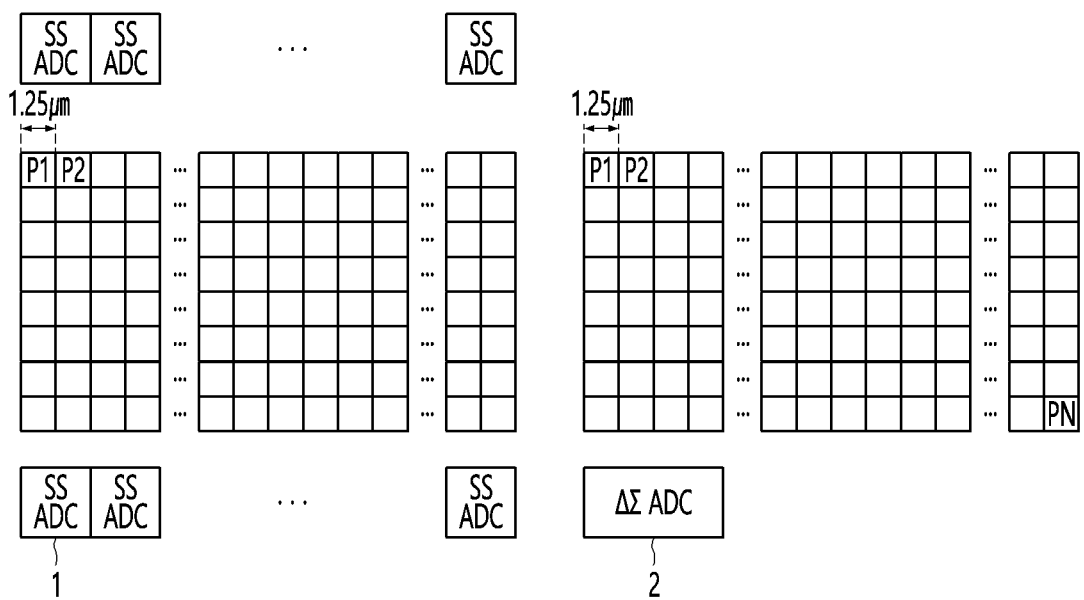
Figures 2, 3:
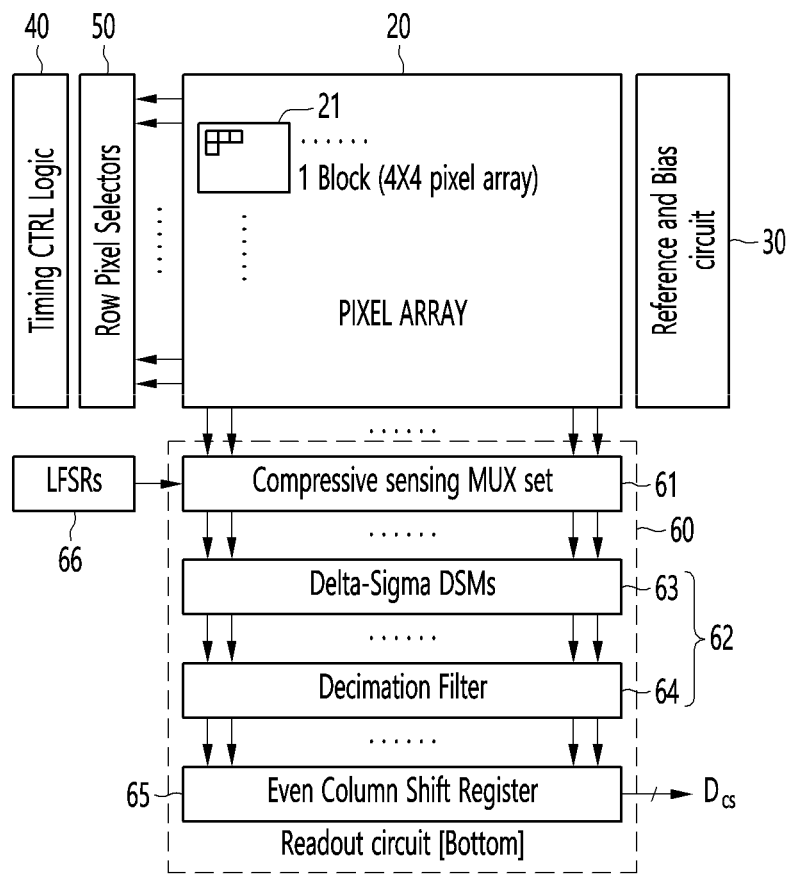
FIG. 2 is a table showing the number of times of sampling required by a single-slope ADC and a delta-sigma ADC according to a resolution of the ADC.
FIG. 3 is a schematic block diagram of an image sensor according to an embodiment of the present disclosure.

FIG. 3 is a schematic block diagram of an image sensor according to an embodiment of the present disclosure.

Referring to FIG. 3, the image sensor 10 may be implemented by using a complementary metal-oxide semiconductor (CMOS) image sensor, but is not limited thereto. In addition, the image sensor 10 may be implemented by using a compressive sensing image sensor applying a compressive sensing method as will be described below.

The image sensor 10 may include a pixel array 20, a reference and bias circuit 30, a timing control logic 40, a row pixel selector 50, and a readout circuit 60. The image sensor 10 shown in FIG. 3 is merely for convenience of explanation, and may include more or fewer components than the image sensor 10 according to an embodiment.

The pixel array 20 may have an array structure having a plurality of pixels extended in the horizontal direction and the vertical direction. Each of the plurality of pixels may include a photoelectric transformation element such as a photo diode or a photo transistor, and a plurality of transistors to transmit an analogue voltage (or an analogue signal) outputted from the photoelectric transformation element to the readout circuit 60 or the outside of the pixel array 20.

The image sensor 10 according to an embodiment of the present disclosure may apply a block-based compressive sensing method other than a normally used rolling shutter method. Accordingly, the pixel array 20 may be divided into a plurality of blocks, and each of the blocks may be configured with an array having at least one pixel. In this case, the plurality of blocks may be arranged within the pixel array 20 as a kind of array (a plurality of block rows and a plurality of block columns).

In the present specification, it is assumed that one block 21 is configured with an array of a 4×4 pixel structure, and accordingly, 16 pixels are included in one block 21. However, the configuration of the block 21 may be changed freely according to an embodiment.

The reference and bis circuit 30 may provide a bias voltage necessary for operations of the pixels of the pixel array 20, and the readout circuit 60. The timing control logic 40 may generate various timing signals necessary for controlling operations of the respective components 20, 50, 60, and may output the generated timing signals to the respective components.

The row pixel selector 50 may activate the plurality of pixel rows included in the pixel array 20 in sequence. When a specific pixel row is activated, pixel data may be outputted from the respective pixels included in the corresponding pixel row.

The readout circuit 60 may process an analogue voltage or a signal (pixel data) outputted from the pixels of the pixel array 20, and may convert the same into a digital code. In particular, the readout circuit 60 according to an embodiment of the present disclosure may include a compressive sensing multiplexing block 61, a delta-sigma modulation block 63, a decimation filter block 64, a column shift register 65, and a plurality of linear feedback shift registers (LFSRs) 66. Herein, the delta-sigma modulation block 63 and the decimation filter block 64 may be integrated and may be defined as a delta-sigma ADC block 62.

The compressive sensing multiplexing block 61 may include a plurality of compressive sensing multiplexers (MUXs). A plurality of pixel data on a corresponding block from among the plurality of blocks of the pixel array 20 may be inputted to each of the plurality of compressive sensing multiplexers, and at least one pixel data arbitrarily selected from the inputted plurality of pixel data by the LFSR 66 may be outputted to the delta-sigma ADC 62. According to an embodiment, a plurality of blocks included in the same block column may correspond to one compressive sensing multiplexer. In addition, according to an embodiment, the plurality of compressive sensing multiplexers may correspond to one block.

Each of the plurality of LFSRs 66 may cause at least one pixel data arbitrarily selected from the plurality of pixels data inputted to the corresponding compressive sensing multiplexer to be outputted to the delta-sigma ADC 62, thereby enabling compressive sensing for the block 21. To restore compressive sensing data afterward, the LFSR 66 may arbitrarily select at least one pixel data from the plurality of pixel data by applying a pseudo-random number generation method.

The delta-sigma modulation block 63 may include a plurality of delta-sigma modulators, and the decimation filter block 64 may include a plurality of decimation filters. Each of the plurality of delta-sigma modulators and each of the plurality of decimation filters may receive the at least one pixel data (analogue voltage) selected and outputted by the corresponding compressive sensing multiplexer and the LFSR 66, and may delta-sigma modulate the received pixel data and may generate a digital code. The generated digital code may correspond to compressive sensing data. The delta-sigma modulator may be implemented by using a second-order delta-sigma modulator, but is not limited hereto. In addition, the delta-sigma ADC may be configured with the delta-sigma modulator and the decimation filter.

The column shift register 65 may transmit the compressive sensing data generated at the delta-sigma ADC 62 to the outside of the image sensor 10. For example, if the image sensor 10 is implemented in a mobile terminal such as a smartphone, a tablet PC, or the like, the compressive sensing data may be transmitted to a memory of the mobile terminal or may be transmitted to a display of the mobile terminal. A controller of the mobile terminal may restore the compressive sensing data based on information on the pseudo-random number generation method of the LFSR 66. According to the result of restoring, the controller may obtain a compressive sensing image and may display the obtained compressive sensing image through the display. Quality of the compressive sensing image may vary according to a compression ratio, and the number or quantity of compressive sensing data per block may vary according to the compression ratio. As the compression ratio increases, the number or quantity of the compressive sensing data may increase and the quality of the compressive sensing image may be enhanced. On the other hand, as the compression ratio decreases, the number or quantity of the compressive sensing data may decrease and the quality of the compressive sensing image may be reduced.

Figure 4:
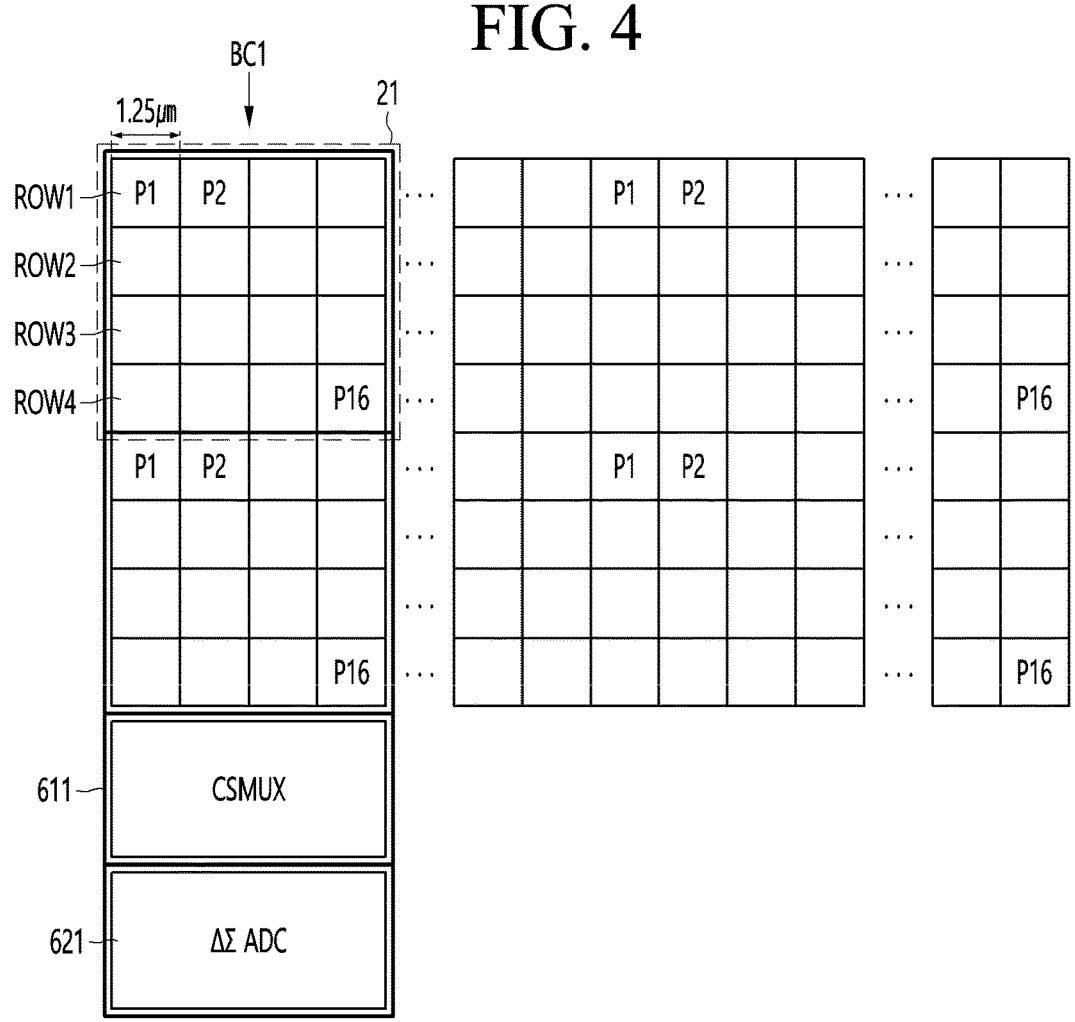
FIG. 4 is a view provided to explain a pixel array, a compressive sensing multiplexer, and a delta-sigma ADC of the image sensor in detail according to an embodiment of the present disclosure.

FIG. 4 is a view provided to explain the pixel array, the compressive sensing multiplexer, and the delta-sigma ADC of the image sensor in detail according to an embodiment of the present disclosure.

Referring to FIG. 4, the image sensor 10 according to an embodiment of the present disclosure may use a block-based compressive sensing method, and accordingly, one ADC may not be connected to every pixel column of the pixel array 20 as in the related-art technology. That is, according to the present disclosure, at least one ADC may be connected to each of the block columns, and may perform the block-based compressive sensing method. Therefore, the number of ADCs included in the image sensor 10 can be reduced. Accordingly, in the image sensor 10 of high pixels requiring a high-resolution ADC, a delta-sigma ADC having a fast operating speed compared to a single-slope ADC may be used.

As described above, the plurality of blocks included in the pixel array 20 may be arranged in an array form. In this case, each of the plurality of block columns may correspond to at least one of the plurality of compressive sensing multiplexers included in the compressive sensing multiplexing block 61, and may correspond to at least one of the plurality of delta-sigma ADCs of the delta-sigma ADC block 62.

For example, as shown in FIG. 4, a first block column BC1 including a first block 21 may correspond to a first compressive sensing multiplexer 611 of the compressive sensing multiplexing block 61, and may correspond to a first delta-sigma ADC 621 of the delta-sigma ACD block 62.

A process of obtaining compressive sensing data from pixel data of the first block 21 will be described briefly as follows.

A $1^{st}$ row ROW1 to a $4^{th}$ row ROW4 of the first block 21 may be activated in sequence by the row pixel selector 50. As the $1^{st}$ row ROW1 to the $4^{th}$ row ROW4 are activated in sequence, respective pixel data of a $1^{st}$ pixel P1 to a $16^{th}$ pixel P16 of the first block 21 may be outputted to the first delta-sigma ADC 621 through the first compressive sensing multiplexer 611. In this case, the LFSR 66 may arbitrarily select pixel data of one group from the respective pixel data of the $1^{st}$ pixel P1 to the $16^{th}$ pixel P16 based on the pseudo-random number generation method, and may output the pixel data of the one group to the first delta-sigma ADC 621. The pixel data of the one group may refer to at least one pixel data outputted from each of at least one pixel of the $1^{st}$ pixel P1 to the $16^{th}$ pixel P16.

The first delta-sigma ADC 621 may perform delta-sigma modulation with respect to the pixel data group outputted through the first compressive sensing multiplexer 611 and the LFSR 66. As a result of the delta-sigma modulation, the image sensor 10 may obtain compressive sensing data having a digital code format. The obtained compressive sensing data may be outputted to the outside of the image sensor 10. A controller or an image signal processor (ISP) of various types of electronic devices including the image sensor 10 may obtain a compressive sensing image by restoring the compressive sensing data. When one compressive sensing data is obtained regarding the 16 pixels P1-P16 included in the first block 21 as shown in the above-described embodiment, the compression ratio may correspond to 1/16.

When there are a plurality of compressive sensing multiplexers and a plurality of delta-sigma ADCs corresponding to a specific block as will be described in FIG. 6, a plurality of compressive sensing data may be obtained from the corresponding block. For example, when there are four compressive sensing multiplexers and four delta-sigma ADCs corresponding to the first block 21, the ADCs may operate in parallel with one another. When each ADC operates a single time, four compressing sensing data in total may be obtained, and, in this case, the compression ratio may correspond to 1/4. When each ADC operates four times, 16 compressive sensing data in total may be obtained, and the compression ratio may be 1. Therefore, a compressive sensing image having the same quality as an original image may be obtained. In this case, an operating time is the same as the operating time of a rolling shutter method using four ADCs.

That is, since the compressive sensing image having the compression ratio of 1/4 is obtained simply by operating each ADC a single time, the quality of the image may be slightly reduced, but a more enhanced frame rate can be provided. Since the above-described compressive sensing data obtaining process uses only the pixel data of some pixels selected from the pixels included in the first block 21 by the LFSR 66, the quality of the compressive sensing image obtained by restoring at least one compressive sensing data may be lower than the quality of the original image. In this case, the quality of the compressive sensing image obtained from the plurality of compressive sensing data may be enhanced by repeating the above-described compressive sensing data obtaining process with respect to the first block 21, but it may be difficult to ensure enhancement of the frame rate in comparison to the rolling-shutter method.

Regarding this, the image sensor 10 according to an embodiment of the present disclosure may generate a compressive sensing image on a current frame by using already obtained compressive sensing data and compressive sensing data obtained regarding the current frame when making a video, and in particular, may perform the compressive sensing data obtaining process with respect to the current frame a single time, such that a frame rate can be enhanced while maintaining a high compression ratio. This will be described hereinbelow with reference to FIGS. 6 to 8.

Figure 5:
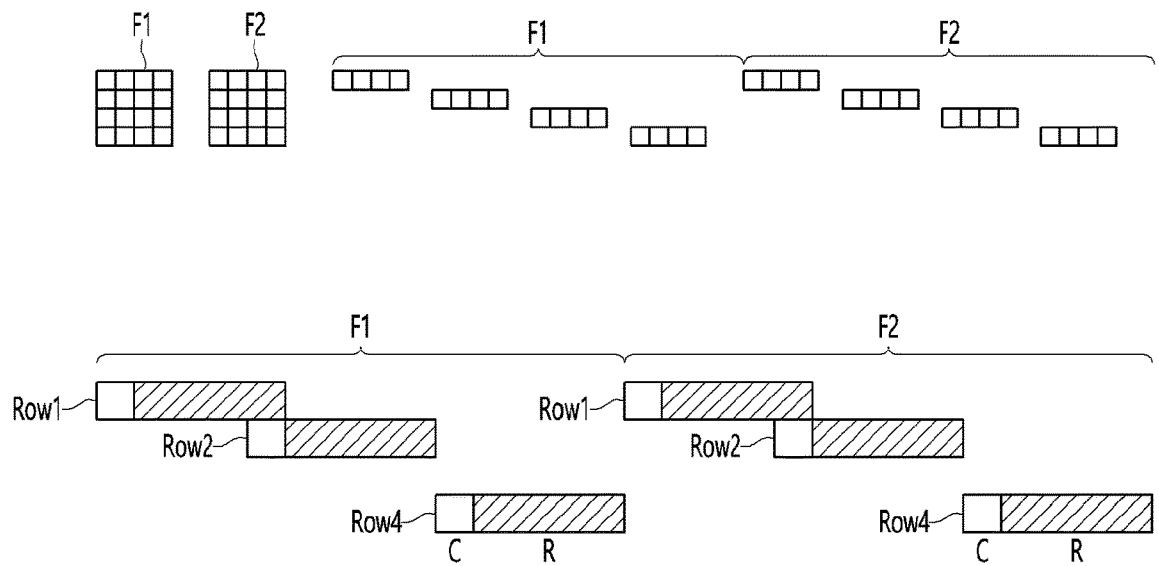

FIGS. 5 and 6 are views provided to explain a difference between a related-art rolling shutter video coding method and a compressive sensing video coding method according to an embodiment of the present disclosure.

In FIGS. 5 and 6, a first image frame F1 is defined as a start frame of a video image made by the image sensor 10, and a second image frame F2 is defined as the next frame of the first image frame F1.

In FIGS. 5 and 6, it is assumed that four ADCs are connected to each image frame F1, F2. In the case of FIG. 5, one ADC may be connected to each of the four pixel columns, and in the case of FIG. 6, four ADCs may be connected to the block of the image frame F1, F2.

Referring to FIG. 5, in the case of the rolling shutter video coding method, all pixel data from the $1^{st}$ Row1 to the $4^{th}$ row Row4 may be processed in configuring one image frame (for example, the first image frame F1), and then one image frame may be generated. Since most of the time taken to process one row is a readout time, a frame rate may be restricted by the readout time in the case of the rolling shutter video coding method. In the embodiment of FIG. 5, 16 pixels data in total for each image frame may be processed by the four ADCs. Each ADC may operate four times with respect to the $1^{st}$ row Row1 to the $4^{th}$ row Row4. In particular, in the case of the related-art rolling shutter video coding method, the above-described process should be performed for every image frame, and thus, each ADC may operate four times with respect to the second image frame F2 as shown in FIG. 5.

On the other hand, referring to FIG. 6, in the case of the compressive sensing video coding method according to an embodiment of the present disclosure, one image frame may be configured by obtaining a plurality of compressive sensing data with respect to a frame of a specific block. In this method, data enough to configure one image frame can be obtained simply by operating each ADC a single time, although the compression ratio is low. Accordingly, the time taken to obtain one image frame can be reduced in comparison to the rolling shutter video coding method.

For example, in the embodiment of FIG. 6, it is assumed that the compression ratio is 1, that is, 16 compressive sensing data are obtained from the original image frame to obtain a compressive sensing image of the same quality as the original image frame by using the compressive sensing video coding method. In this case, the image sensor 10 may obtain $1^{st}$ compressive sensing data to $16^{th}$ compressive sensing data CSF1-CSF16 with respect to the first image frame F1, and may output the 16 compressive sensing data to the outside of the image sensor 10 as data for restoring the first image frame F1. To achieve this, each of the ADC operates four times, and thus the operating time is substantially the same as that of the rolling shutter video coding method of FIG. 5.

Thereafter, the image sensor 10 may obtain $17^{th}$ compressive sensing data to $20^{th}$ compressive sensing data CSF17-CSF20 from the second image frame F2, and may obtain a second compressive sensing image frame by using the already obtained $5^{th}$ compressive sensing data and $16^{th}$ compressive sensing data CSF5-CSF16, and the $17^{th}$ compressive sensing data to the $20^{th}$ compressive sensing data CSF17-CSF20. That is, regarding the second image frame F2, each ADC operates only a single time to obtain the $17^{th}$ compressive sensing data to the $20^{th}$ compressive sensing data CSF17-CSF20. Therefore, compared to that in the embodiment of FIG. 5, a processing speed of the second image frame F2 can increase four times, and the compression ratio is maintained as 1. Accordingly, the second compressive sensing image frame having substantially the same quality as that of the second image frame F2 can be obtained.

In addition, a frame rate of the image sensor can be additionally enhanced by using the delta-sigma ADC instead of a related-art method using a single-slope ADC of a high resolution.

The number or quantity of compressive sensing data required to obtain one compressive sensing image frame may be changed according to a set compression ratio. As described above, on the assumption that 16 compressive sensing data are obtained if the compression ratio is 1, 8 compressive sensing data may be obtained if the compression ratio is 1/2, and a compressive sensing image frame may be obtained.

Figure 7:
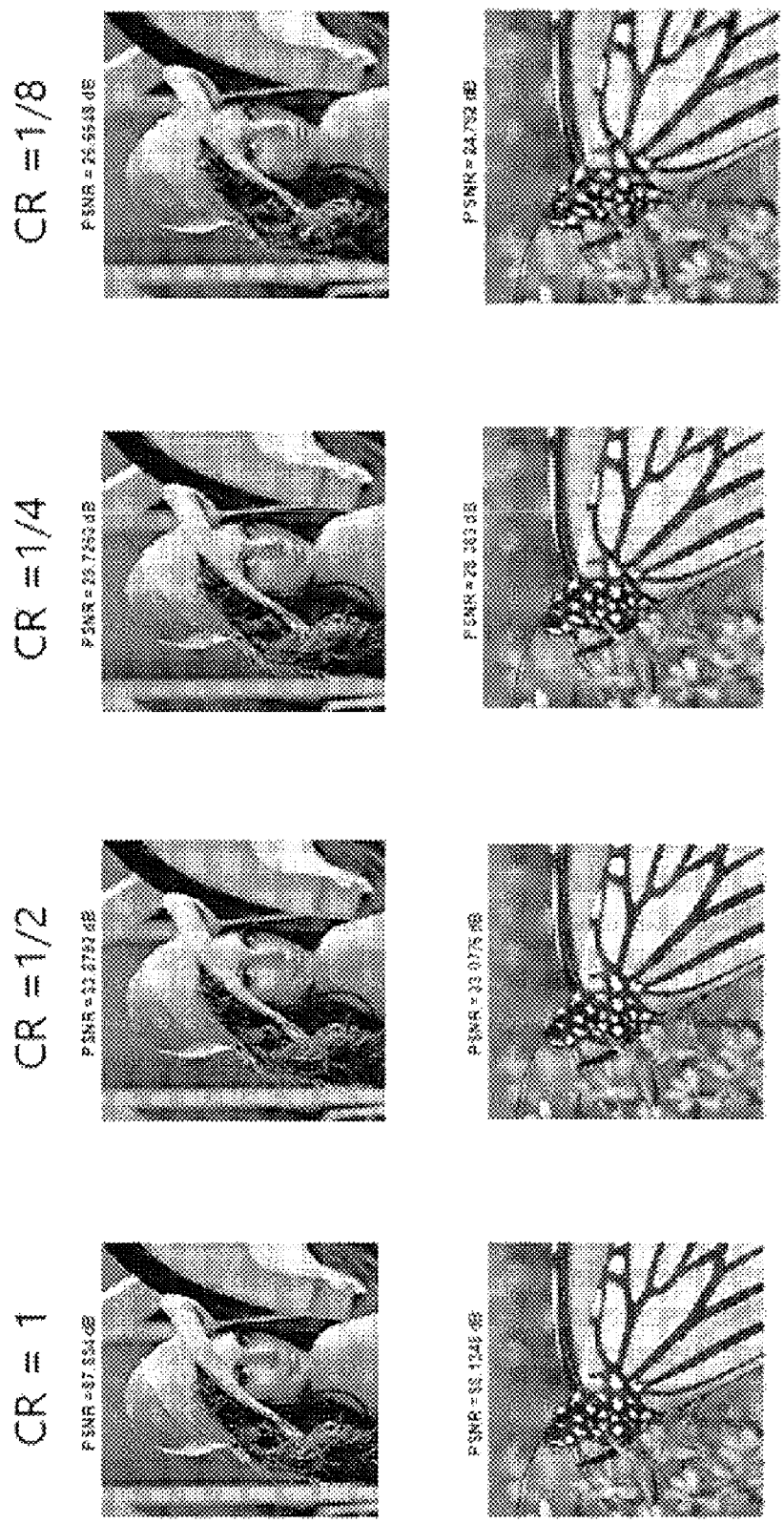
FIG. 7 is a view illustrating comparison of images displayed according to a compression ratio when the block-based compressive sensing method is applied according to an embodiment of the present disclosure.

FIG. 7 is a view illustrating comparison of images displayed according to compression ratios when the compressive sensing video coding method is applied according to an embodiment of the present disclosure.

Referring to FIG. 7, it can be seen that, when the block-based compressive sensing method is applied according to an embodiment of the present disclosure, quality of an image increases as a compression ratio (CR) increases. For example, a PSNR of the image may be about 88 dB if the compression ratio CR is 1, but a PSNR of the image may be about 29 dB if the compression ratio (CR) is 1/4. That is, in the case of a still image, quality of the compressive sensing image may be slightly reduced according to the compression ratio (CR).

However, when an image of a video is shot, the image sensor 10 according to an embodiment of the present disclosure may obtain a plurality of compressive sensing data and may generate compressive sensing image frames, and in particular, may perform a compressive sensing data obtaining process only a single time with respect to the other frames except for a start frame. Accordingly, since the operating time of the readout circuit 60 for one frame is reduced, a frame rate can be enhanced, and also, a high compression ratio can be maintained. Therefore, quality of a compressive sensing image frame restored afterward can also be maximized.

FIG. 8 is a flowchart provided to explain an operating method of an image sensor according to an embodiment of the present disclosure.

Although the embodiment of FIG. 8 illustrates a process of obtaining compressive sensing data from a certain block 21 from among the blocks of the pixel array 20, the corresponding embodiment may be performed in the same way with respect to all of the blocks of the pixel array 20.

Referring to FIG. 8, the image sensor 10 may obtain m number of first compressive sensing data on a first frame from a first block of the pixel array 20, based on a set compression ratio (S100).

Herein, the first frame is defined as a start frame when the image sensor 10 makes a video.

The number m of the first compressive sensing data may be related to the number of pixels of the first block and the compression ratio. For example, the m may correspond to multiplication of the number of pixels of the first block and the compression ratio. For example, if the number of pixels is 16 and the compression ratio is 1, m may be 16. If the number of pixels is 16 and the compression ratio is 1/2, m may be 8.

The image sensor 10 may output the m number of the first compressive sensing data obtained as data for restoring the first frame (S110).

The m number of the first compressive sensing data obtained may be outputted to the outside of the image sensor 10. For example, if the image sensor 10 is implemented in a mobile terminal such as a smartphone, a tablet PC, or the like, the first compressive sensing data may be transmitted to a memory of the mobile terminal or may be transmitted to a display of the mobile terminal. A controller or an ISP of the mobile terminal may obtain a first compressive sensing image frame by restoring the first compressive sensing data by using information on the pseudo-random number generation method of the LFSR 66.

The image sensor 10 may obtain n number of second compressive sensing data on a second frame from the first block (S120). The second frame may correspond to the next frame of the first frame.

The number n of the second compressive sensing data may be less than or equal to m, and may be the same as the number of ADCs corresponding to the first block. That is, each of the n number of ADCs corresponding to the first block may operate a single time with respect to the second frame, and as a result, the n number of the second compressive sensing data may be obtained.

The image sensor 10 may output, as data for restoring the second frame, m number of compressive sensing data including at least one of the m number of the first compressive sensing data and the n number of the second compressive sensing data (S130).

That is, the data for restoring the second frame may include the m-n number of the first compressive sensing data and the n number of the second compressive sensing data. Since the n number of ADCs operate only a single time with respect to the second frame as described above, the frame rate of the image sensor 10 can be enhanced.

According to an embodiment, the image sensor 10 may output only the n number of the second compressive sensing data as the data for restoring the second frame. In this case, the controller or the ISP of the electronic device may restore a second compressive sensing image frame corresponding to the second frame by using the n number of the second compressive sensing data obtained and the m-n number of the first compressive sensing data already obtained.

FIG. 9 illustrates an example of a simple deterministic measurement matrix used in the present disclosure if a compression ratio for determining a sensing method is 1/4.

Referring to FIG. 9, the number of '1' forming one row of the measurement matrix is the same as the reciprocal of the compression ratio. In addition, this is the same as the number of data included in one measurement value derived through a linear combination of the data.

Figure 10:
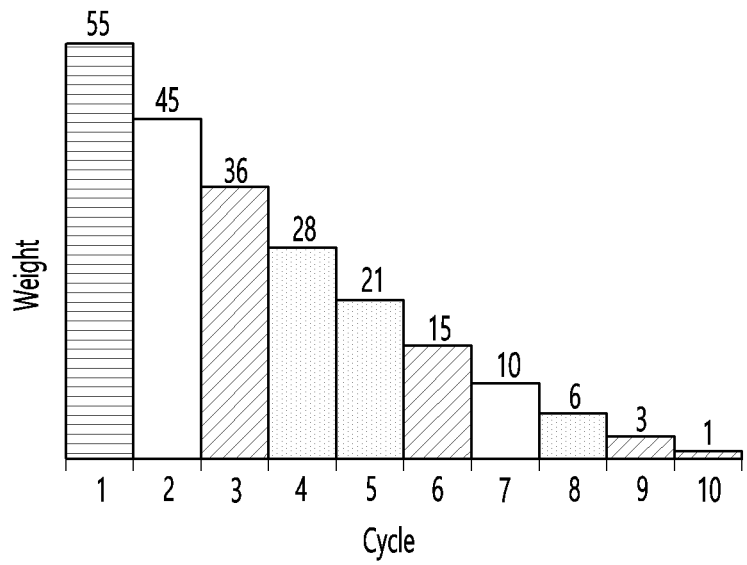
FIG. 10 is a graph illustrating an example of a weight set of a third-order delta-sigma modulator when a solution of a 4-partition problem can be derived.

FIG. 10 illustrates an example of a weight function of a third-order delta-sigma modulator regarding cycles 1 to 10.

As shown in FIG. 10, a high-order delta-sigma modulator may have a different weight according to each input cycle.

Figure 11:
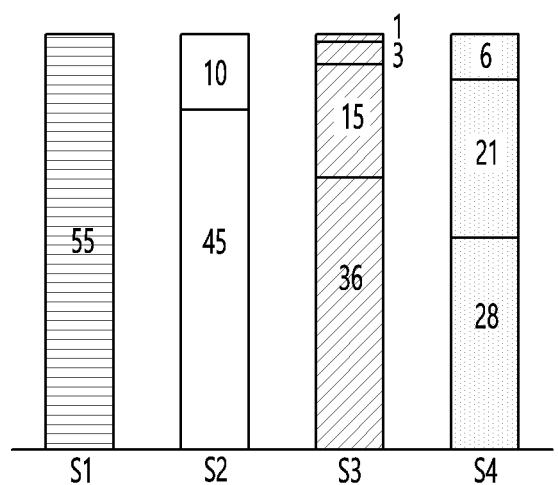
FIG. 11 is a view illustrating an example of splitting into four subsets having the equal sum with respect to FIG. 10 by using the solution of the 4-partition problem.

FIG. 11 illustrates an example of a case where, on the assumption that weights obtained from the weight function of the third-order delta-sigma modulator are a universal set, the universal set can be split into four subsets having the equal sum by being applied to a 4-partition problem.

FIG. 11 illustrates a result of splitting the weights of the third-order delta-sigma modulator suggested in FIG. 10 into four subsets having the equal sum.

Figure 12:
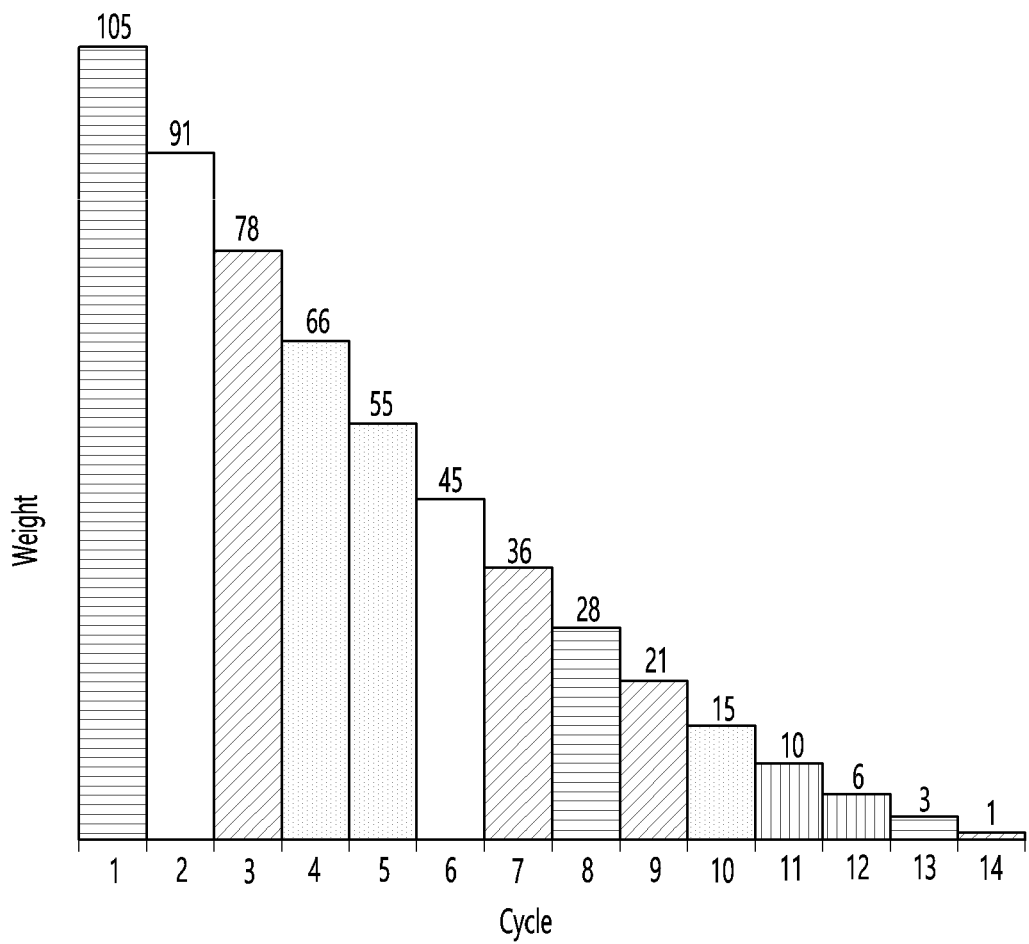
FIG. 12 is a graph illustrating an example of a weight set of a third-order delta-sigma modulator that cannot derive the solution of the 4-partition problem.

FIG. 12 illustrates an example of the weight function of the third-order delta-sigma modulator regarding cycles 1 to 14.

Figure 13:
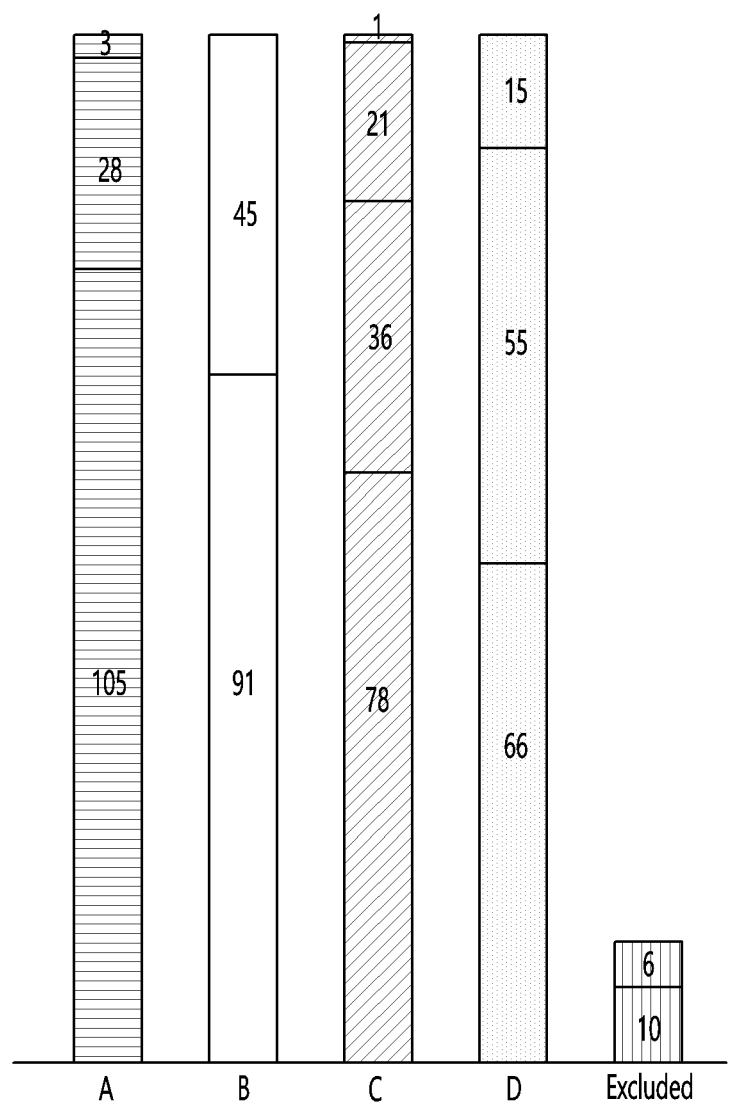
FIG. 13 is a view illustrating an example of splitting into subsets having the equal sum by using the solution of the 4-partition problem if a specific weight is excluded in FIG. 12.

FIG. 13 illustrates an example of a case where, on the assumption that weights obtained from the weight function of the third-order delta-sigma modulator are a universal set, the universal set cannot be split into four subsets having the equal sum by being applied to the 4-partition problem.

FIG. 13 illustrates that, since the weights of the third-order delta-sigma modulator suggested in FIG. 12 are not split into four subsets having the equal sum, arbitrarily selected cycles ($11^{th}$, $12^{th}$ cycles) are excluded and the weights of the other cycles are split into four sets having the equal sum, by being applied to the 4-partition problem In this case, 0 or a specific direct current voltage may be inputted to the excluded cycles.

Figure 14:
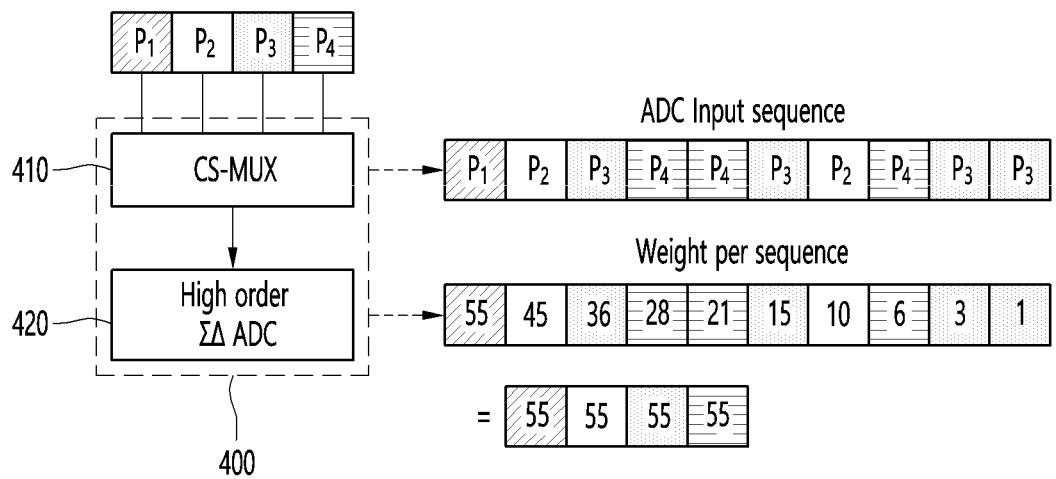
FIG. 14 is a view illustrating an operation of a compressive sensing unit.

FIG. 14 is a view illustrating an operation of a sensing unit.

As shown in FIG. 14, the sensing unit 400 of the image sensor may include a compressed sensing multiplexer (CS-MUX) 410 and a high-order delta-sigma modulator 420.

Referring to FIG. 10, the weight gradually decreases with reference to an initial value in a non-linear pattern in the case of the third-order delta-sigma modulator. If an input signal is inputted to the delta-sigma modulator in sequence, the weight is applied according to the weight function. Accordingly, in the case of a second or higher-order delta-sigma modulator, different weights are applied to signals inputted in sequence, and thus there is a problem in deriving a linear combination.

Referring to FIG. 9, all pixels to constitute a linear combination should have the same weight at the output of the modulator at the time conversion ends in order to derive the linear combination. The sensing unit 400 may operate as follows to derive a linear combination from the second or higher order according to the present disclosure.

Pixels corresponding to the number of pixels to constitute a linear combination are inputted to the compressed sensing multiplexer 410. In this case, the number of pixels to be inputted may be determined by a form of a measurement matrix. The embodiment shown in FIG. 14 illustrates a case where the compression rate is 4 as shown in FIG. 9. Accordingly, it can be seen from FIG. 9 that the linear combination is formed of four pixels. According to FIG. 14, the compressed sensing multiplexer 410 receiving a specific number of pixels simultaneously may input the pixels to the high-order delta-sigma modulator 420 according to the derived inputting order by utilizing a solution of a subset problem as suggested in the present disclosure.

In other words, FIG. 14 illustrates an example if the compression rate is 1/4, and it can be seen that the order of pixels inputted to the high-order delta-sigma modulator is the same as the inputting order derived from the solution of the partition problem as shown in FIG. 10.

Accordingly, when the pixels are inputted to the delta-sigma modulator in the above-described order, all of the pixels have the same weight sum at the time conversion ends. Accordingly, the linear combination of all pixels having the same weight can be derived.

Figure 15:
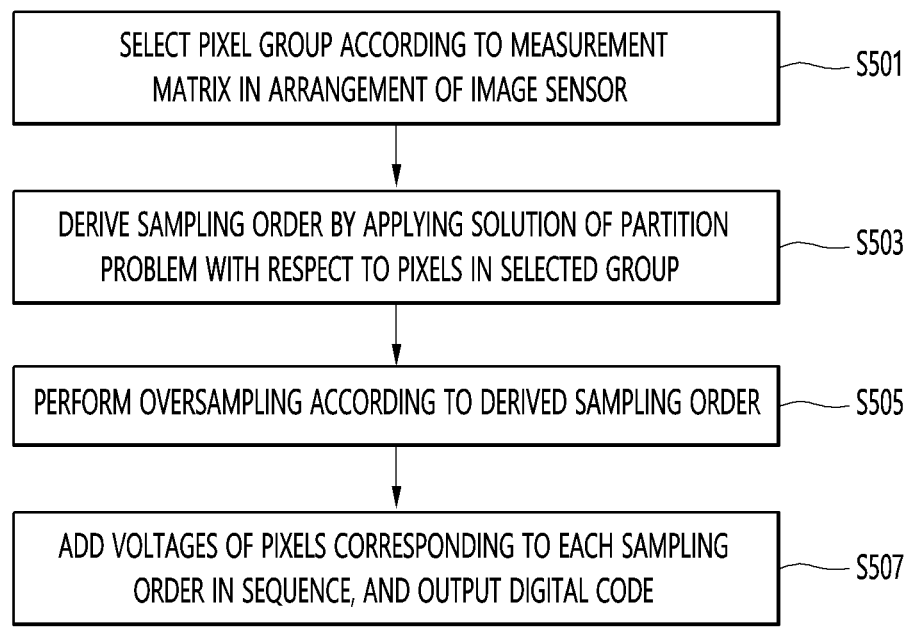
FIG. 15 is a flowchart illustrating a compressive sensing method of an image sensor according to an embodiment of the present disclosure.

FIG. 15 is a flowchart illustrating a compressive sensing method of the image sensor according to an embodiment of the present disclosure.

The compressive sensing method according to an embodiment of the present disclosure (specifically, a method for compressive sensing a natural image signal by using a second or higher-order delta-sigma modulator) includes a step of selecting a certain pixel group according to a measurement matrix in the arrangement of the image sensor (S501), a step of deriving a sampling order by applying a solution of a partition problem to determine an order in which individual pixels in the selected group are inputted to the delta-sigma modulator (S503), a step of performing oversampling according to the sampling order derived by applying the solution of the partition problem (S505), and a step of adding voltages of pixels corresponding to respective sampling orders in sequence after performing the oversampling, and outputting a digital code (S507).

In this case, the second or higher-order sigma-delta modulator may have a different weight function according to the order of the modulator used.

In addition, at the step of selecting the group of the pixels according to the measurement matrix, the measurement matrix and the number of pixels to be selected may be determined according to a compression ratio.

Herein, the step of determining the order of inputting the pixels to the delta-sigma modulator may further include a step of deriving a universal set of weights of respective cycles during the total cycles in consideration of a given sampling cycle and a weight function of the used delta-sigma modulator, a step of splitting the derived universal set of the weights into a plurality of subsets having the equal sum by using a solution of a partition problem, and a step of deriving a sampling order to cause the weights of the individual pixels to be the same at the output of the delta-sigma modulator based on the split set.

Herein, the step of performing the oversampling may include a step of inputting the individual pixels of the pixel group derived according to the measurement matrix into the delta-sigma modulator according to the derived sampling order.

Figures 16, 17:
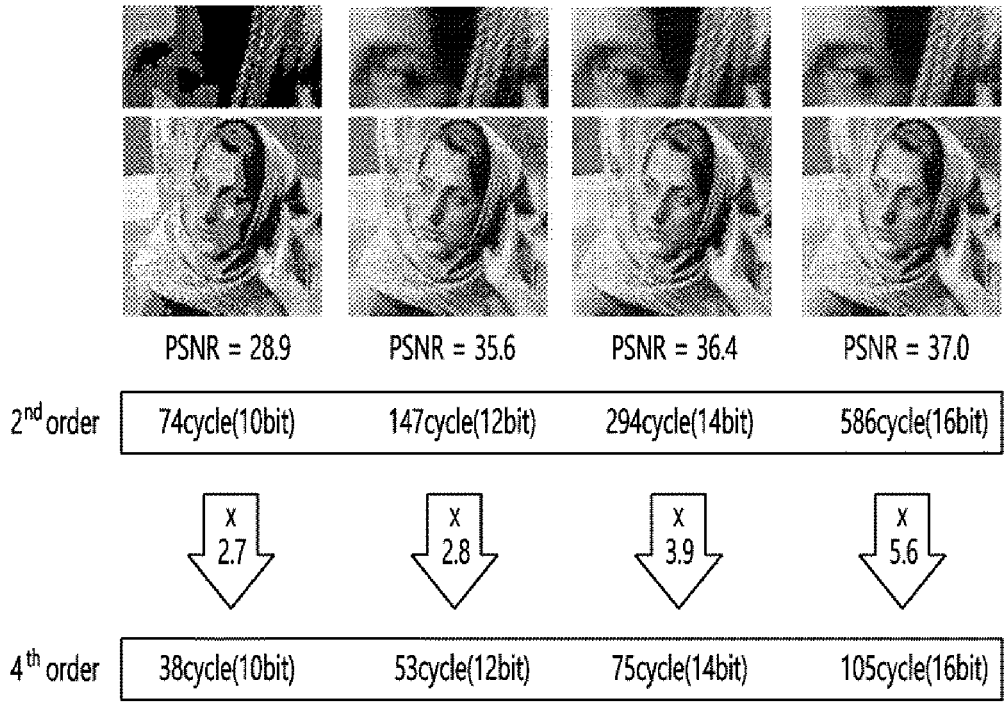
FIG. 16 is a view illustrating comparison of image qualities according to the number of cycles when second-order and fourth-order delta-sigma modulators are used.
FIG. 17 is a graph illustrating comparison of the number of cycles required by first-order to fourth-order delta-sigma modulators, which are designed based on the delta-sigma toolbox provided by Mathworks, to obtain respective resolutions.

FIG. 16 is a view illustrating comparison of qualities of restored images according to the number of cycles by applying the sampling method of the embodiment when second-order and fourth-order delta-sigma modulators are used. Compared to the second-order method, the fourth-order method can increase a sampling speed.

FIG. 17 is a graph illustrating comparison of the number of cycles for first-order to fourth-order delta sigma modulators designed based on the delta-sigma toolbox provided by Mathworks to have their respective resolutions. It is illustrated that the number of necessary cycles is abruptly reduced as the order increases.

According to an embodiment of the present disclosure, the above-described method can be embodied as processor-readable codes on a medium having a program recorded thereon. Examples of the processor-readable medium include a read only memory (ROM), a random access memory (RAM), a CD-ROM, a magnetic tape, a floppy disk, an optical data storage device, or the like, and may be implemented in the form of a carrier wave (for example, transmission through the Internet).

The display device described above is not limited to the configurations and the method of the embodiments described above, and an entirety or a part of the respective embodiments can be selectively combined and configured to make various changes to the above-described embodiments.

The invention claimed is:
1. A compressive sensing image sensor comprising:
a pixel array comprising a plurality of pixels; and a readout circuit configured to receive pixel data on a shot image in an analogue form from the plurality of pixels, and to process the pixel data, wherein the pixel array comprises a plurality of blocks each having a set of pixels arranged in an array form, wherein the readout circuit comprises:

a compressive sensing multiplexer to which a plurality of pixel data outputted from a corresponding block from among the plurality of blocks are inputted;

a linear feedback shift register (LFSR) configured to arbitrarily select at least one pixel data from the plurality of pixel data inputted to the compressive sensing multiplexer; and a delta-sigma analog-to-digital converter (ADC) configured to receive the at least one pixel data selected by the LFSR, to delta-sigma modulate the received at least one pixel data, and to generate compressive sensing data for restoring an image of the corresponding block from among the shot image, wherein the compressive sensing data comprises a plurality of compressive sensing data, wherein a number of the plurality of compressive sensing data is changed based on a set compression ratio, and wherein, when the compressive sensing image sensor makes a video, the readout circuit is configured to output, as data for restoring a current frame of the video, at least one compressive sensing data obtained from the current frame of the video, and at least one compressive sensing data of an already-obtained previous frame.

2. The compressive sensing image sensor of claim 1, wherein the number of the plurality of compressive sensing data increases as the set compression ratio increases.

3. The compressive sensing image sensor of claim 1, wherein the number of the plurality of compressive sensing data is changed based on a number of pixels included in the corresponding block and the set compression ratio.

4. The compressive sensing image sensor of claim 1, wherein the plurality of pixel data outputted from the corresponding block from among the plurality of blocks is included in a corresponding block column from among the plurality of blocks and are inputted to the compressive sensing multiplexer.

5. The compressive sensing image sensor of claim 1, wherein the LFSR is configured to arbitrarily select the at least one pixel data from the plurality of pixel data by applying a pseudo-random number generation method.

6. The compressive sensing image sensor of claim 1, wherein the delta-sigma ADC comprises a delta-sigma modulator and a decimation filter, and wherein the delta-sigma modulator is a second-order delta-sigma modulator.

7. An operating method of a compressive sensing image sensor for making a video, the method comprising the steps of:

(a) obtaining a plurality of pixel data on a first frame of the video from a block having a plurality of pixels;

(b) selecting pixel data of one group comprising at least one pixel data from among the obtained plurality of pixel data; and (c) obtaining first compressive sensing data for restoring the first frame of the video from the block by performing delta-sigma modulation with respect to the selected pixel data of the one group by using an ADC corresponding to the block, wherein the first compressive sensing data comprises an M number of first compressive sensing data, further comprising a step of obtaining, from the block, an N number of second compressive sensing data on a second frame which is a next frame of the first frame, wherein compressive sensing data for restoring the second frame comprises an M-N number of the first compressive sensing data and the N number of the second compressive sensing data, and wherein the N number has a value less than or equal to the M number.

8. The method of claim 7, wherein the step of (a) and the step of (b) are performed at least a single time, and wherein the M number is determined based on a number of pixels of the block and a set compression ratio, and the M number has a value greater than or equal to 1.

9. The method of claim 8, wherein the M number increases as the set compression ratio increases.

10. The method of claim 7, wherein the N is a number of ADCs corresponding to the block, wherein the step of obtaining the N number of the second compressive sensing data is performed on each of the N number of ADCs a single time.

11. The method of claim 7, wherein the step of selecting the pixel data of the one group comprises arbitrarily selecting the pixel data of the one group from the plurality of pixel data by applying a pseudo-random number generation method.

* * * * *